(12) United States Patent
Elwany

(10) Patent No.: US 8,561,814 B2
(45) Date of Patent: Oct. 22, 2013

(54) STACKABLE MODULAR PERSONAL COMPUTER ARRAY

(75) Inventor: Magdy Elwany, Dallas, TX (US)

(73) Assignee: M&A Technology, Inc., Carrollton, TX (US)

( * ) Notice: Subject to any disclaimer, the term of this patent is extended or adjusted under 35 U.S.C. 154(b) by 0 days.

(21) Appl. No.: 13/593,509

(22) Filed: Aug. 24, 2012

(65) Prior Publication Data

US 2012/0318756 A1 Dec. 20, 2012

Related U.S. Application Data

(63) Continuation of application No. 12/770,934, filed on Apr. 30, 2010.

(51) Int. Cl.
*A47F 7/00* (2006.01)

(52) U.S. Cl.
USPC .......................... 211/26; 361/679.46; 454/184

(58) Field of Classification Search
USPC .................................. 211/26, 189, 103, 187;
361/679.46–679.54, 724–727,
361/688–689, 694–695, 715; 312/223.1,
312/223.2, 213, 236; 454/184
See application file for complete search history.

(56) References Cited

U.S. PATENT DOCUMENTS

| | | | |
|---|---|---|---|
| 4,895,326 A | 1/1990 | Nimpoeno et al. | |
| 5,400,215 A | 3/1995 | Chung | |
| 5,412,534 A | 5/1995 | Cutts et al. | |
| 5,593,220 A * | 1/1997 | Seid et al. ................. | 312/265.6 |
| 5,684,671 A | 11/1997 | Hobbs et al. | |
| 5,694,290 A | 12/1997 | Chang | |
| 5,737,189 A | 4/1998 | Kammersgard et al. | |
| 6,024,426 A | 2/2000 | Korinsky et al. | |
| 6,038,126 A | 3/2000 | Weng | |
| 6,246,580 B1 | 6/2001 | Weng | |
| 6,288,902 B1 | 9/2001 | Kim et al. | |
| 6,370,022 B1 | 4/2002 | Hooper et al. | |
| 6,418,011 B2 | 7/2002 | Omori | |
| 6,445,586 B1 | 9/2002 | Chou | |
| 6,473,297 B1 | 10/2002 | Behl et al. | |
| 6,549,424 B1 | 4/2003 | Beseth et al. | |
| 6,616,251 B2 | 9/2003 | Searby | |
| 6,628,518 B2 | 9/2003 | Behl et al. | |
| 6,636,422 B1 | 10/2003 | Tanzer et al. | |
| 6,637,719 B2 | 10/2003 | Jiang | |
| 6,654,241 B2 | 11/2003 | Hillyard et al. | |
| 6,927,976 B1 | 8/2005 | Malone et al. | |
| 7,085,131 B2 | 8/2006 | Peng et al. | |
| 7,236,370 B2 * | 6/2007 | Coglitore et al. ............. | 361/724 |
| 7,251,132 B1 | 7/2007 | Paul et al. | |
| 7,286,345 B2 | 10/2007 | Casebolt | |
| 7,315,456 B2 * | 1/2008 | Mondor et al. ............... | 361/788 |

(Continued)

*Primary Examiner* — Darnell Jayne
*Assistant Examiner* — Hiwot Tefera

(57) ABSTRACT

One aspect of this disclosure is directed to a sub-rack module for supporting a personal computer chassis therein. The sub-rack module is configured to be received within a multi-position support rack. Due to the unique combination of the sub-rack and the multi-position support rack, the sub-rack modules can be positioned such that the back ends of the personal computer chassis form an air passageway in the center of the multi-position support rack, which allows for the air flow to be directed through the passageway and out through the front end of the personal computer chassis. This configuration allows for the high density storage of an array of personal computer chassis while providing adequate cooling for multiple units. A method for manufacturing this system is also provided.

5 Claims, 4 Drawing Sheets

(56) References Cited

U.S. PATENT DOCUMENTS

| | | |
|---|---|---|
| 7,450,383 B1 | 11/2008 | Li et al. |
| 7,480,963 B2 * | 1/2009 | Liang .............................. 16/422 |
| 7,499,273 B2 | 3/2009 | Casebolt |
| 7,567,437 B2 | 7/2009 | Liang |
| 7,583,507 B2 | 9/2009 | Starr et al. |
| 7,588,492 B2 | 9/2009 | Ballard et al. |
| 7,679,896 B2 | 3/2010 | Deng et al. |
| 7,782,606 B2 | 8/2010 | Baker et al. |
| 7,929,303 B1 * | 4/2011 | Merrow ........................ 361/695 |
| 8,004,839 B2 | 8/2011 | Sato et al. |
| 8,094,451 B2 | 1/2012 | Bellin et al. |
| 2003/0003816 A1 | 1/2003 | Bolognia et al. |
| 2003/0011976 A1 | 1/2003 | Treiber et al. |
| 2003/0128512 A1 | 7/2003 | Owens et al. |
| 2003/0222549 A1 | 12/2003 | Tango |
| 2004/0004813 A1 * | 1/2004 | Coglitore et al. ............. 361/687 |
| 2004/0070936 A1 | 4/2004 | Coglitore et al. |
| 2004/0075983 A1 | 4/2004 | Thompson et al. |
| 2005/0061755 A1 | 3/2005 | Davis et al. |
| 2005/0062378 A1 * | 3/2005 | Wojcik ....................... 312/332.1 |
| 2005/0168932 A1 | 8/2005 | Selvidge et al. |
| 2005/0265004 A1 | 12/2005 | Coglitore et al. |
| 2005/0270751 A1 | 12/2005 | Coglitore et al. |
| 2005/0286235 A1 * | 12/2005 | Randall et al. ................ 361/724 |
| 2006/0018094 A1 | 1/2006 | Robbins et al. |
| 2006/0176664 A1 | 8/2006 | Casebolt |
| 2006/0250777 A1 | 11/2006 | Chen et al. |
| 2006/0285292 A1 | 12/2006 | Fan et al. |
| 2007/0247036 A1 | 10/2007 | Fuh et al. |
| 2008/0047961 A1 | 2/2008 | Liang |
| 2008/0049393 A1 | 2/2008 | Coglitore et al. |
| 2008/0094795 A1 | 4/2008 | Neal |
| 2009/0289532 A1 | 11/2009 | Chou |

* cited by examiner

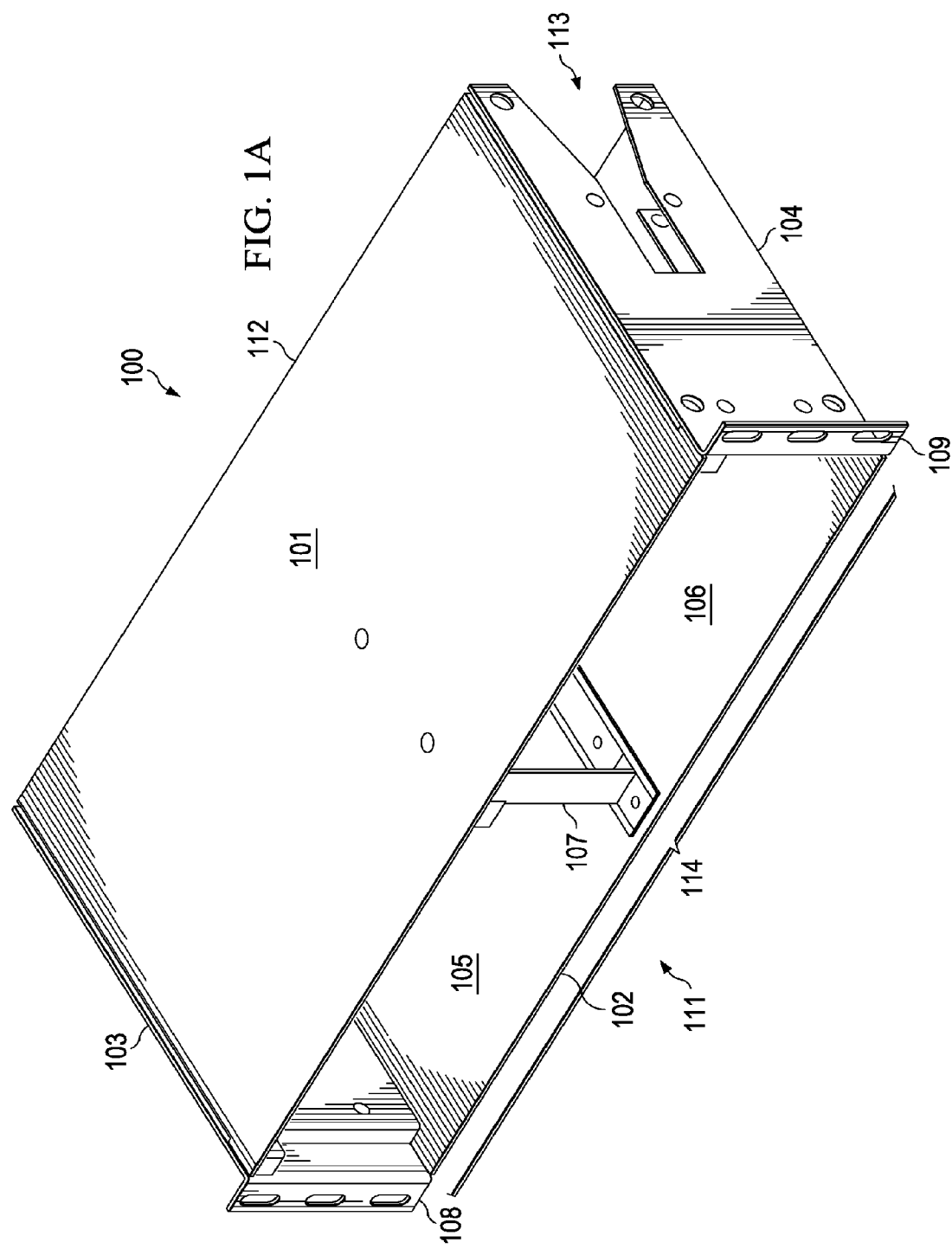

STACKABLE MODULAR PERSONAL COMPUTER ARRAY

CROSS-REFERENCE TO RELATED APPLICATIONS

This application is a continuation of U.S. application Ser. No. 12/770,934, filed Apr. 30, 2010, pending, the disclosures of which are fully incorporated herein by reference for all purposes.

TECHNICAL FIELD

This application is directed, in general, to a network of personal computers and, more specifically, to a modular, centralized, high density, personal computer system with remote operation.

BACKGROUND

Presently, most office environments are served by a computer system comprising a central server coupled to a local area network (LAN) and often also to a wide area network (WAN) and the Internet. Coupled to the LAN is a plurality of personal computers distributed throughout individual offices of the company. This provides a central location where the server and the networks can easily be maintained by an information technology (IT) technician. With the personal computers distributed in individual offices, data that may be required by more than one user must be copied or transferred to the central server or software network provisions made for, usually secure, access to a computer in another part of the company. For example, a large headquarters building of a company, e.g. a bank, may have workers over several floors that need to access individual account data at varying times, e.g., teller, home loan department, vehicle loan department, etc., Additionally, with personal computers distributed throughout spaced-apart offices, the cooling requirements are more distributed, perhaps frequently requiring re-balancing the office air conditioning systems as seasons change. Moreover, individual computer units are relatively large and take up space within the individual's office.

SUMMARY

One aspect, as set forth herein, provides a sub-rack module for supporting a personal computer chassis therein. In this aspect, the sub-rack module comprises an open-ended support module having a top, a bottom, and first and second sides, and a through aperture extending from a front of the open-ended support module to a rear of said open-ended support module. The through aperture has a side-to-side width sufficient to receive a computer chassis therein. The top side of the open-ended support module has a front to rear length such that ventilation apertures of the computer chassis are exposed at the rear when the computer chassis is positioned within the open-ended support module.

In another aspect a system for stacking modular personal computers is provided. This embodiment comprises open-ended support modules each having a top, a bottom, and first and second sides, and a through aperture extending from a front to a rear of the open-ended support modules. The through apertures have a side-to-side width sufficient to receive at least one computer chassis therein. The top side of each open-ended support module has a front to rear length such that ventilation apertures of a computer chassis are exposed at the rear when the at least one computer chassis is positioned within the open-ended support module. This embodiment further includes a multi-position support rack having frame support members coupled together to form a plurality of support locations for the open-ended support modules. The open-ended support modules are located within and supported by the multi-position support rack at least a portion of the support locations.

In a further aspect, a method of manufacturing a system for stacking modular personal computers is provided. This embodiment comprises forming a plurality of open-ended support modules, each having a top, a bottom, and first and second sides, and a through aperture extending from a front of the open-ended support module to a rear of the open-ended support module. The through aperture has a side-to-side width sufficient to receive at least one computer chassis therein. The top side of the open-ended support module has a front to rear length such that ventilation apertures of the computer chassis are exposed at the rear of the open-ended support module when the computer chassis is positioned within the open-ended support module. The method further includes forming a multi-position support rack having frame support members coupled together to form a plurality of support locations for the open-ended support modules, and removably securing at least a portion of the open-ended support modules within the multi-position support rack at one of the support locations.

BRIEF DESCRIPTION

Reference is now made to the following descriptions taken in conjunction with the accompanying drawings, in which:

FIG. 1A is an isometric view of one embodiment of an open-ended support module constructed according to the principles of the present invention;

DETAILED DESCRIPTION

Figure 1B:
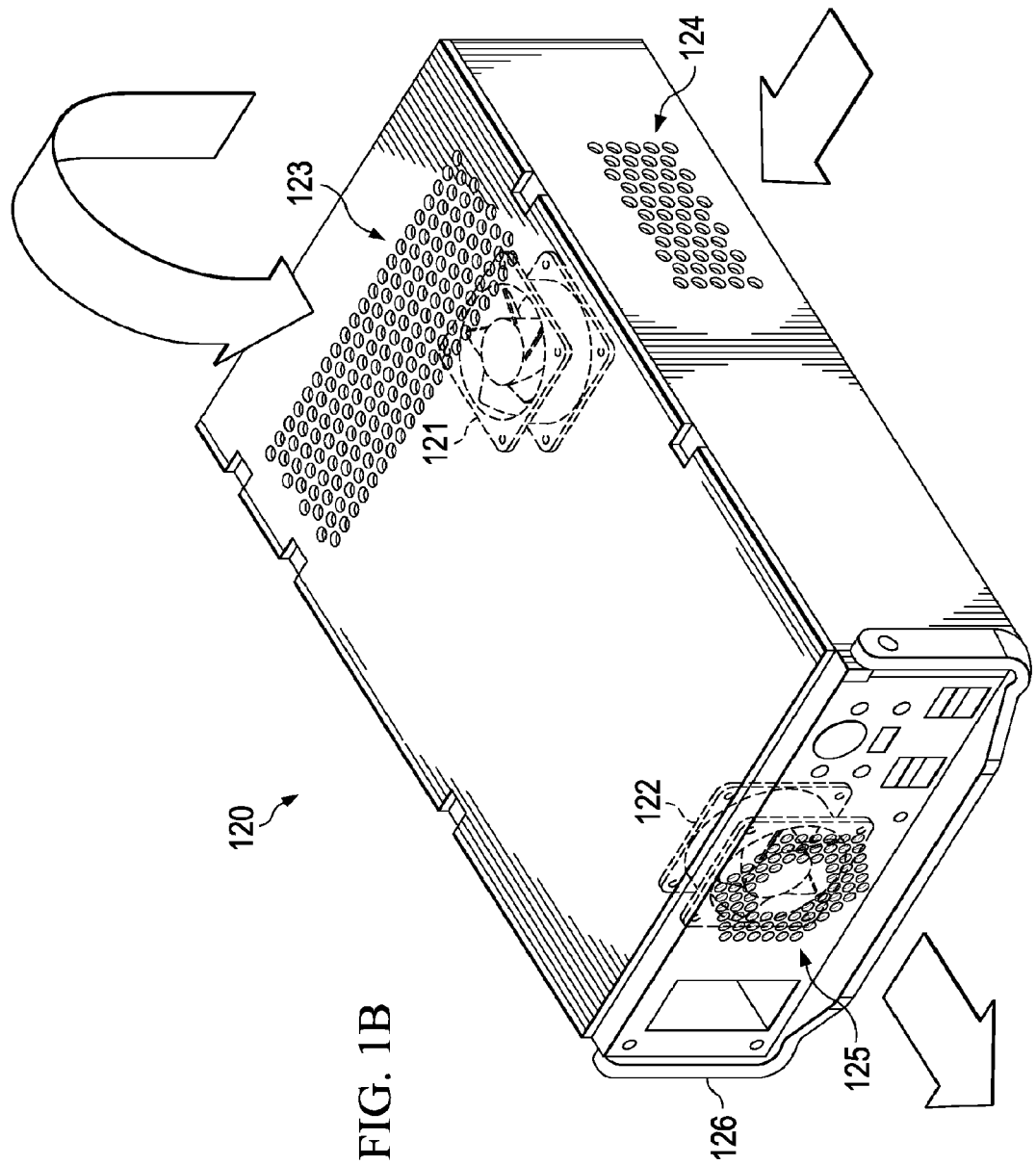
FIG. 1B is an isometric view of one embodiment of a computer chassis constructed according to the principles of the present invention.

Referring initially to FIG. 1A, illustrated is an isometric view of one embodiment of a sub-rack module 100 constructed according to the principles of the present invention. The sub-rack module 100 comprises an open-ended support module 100 having a top 101, a bottom 102, first and second sides 103, 104, respectively, an optional central divider or partition 107, first and second mounting flanges 108, 109, respectively, and a through aperture 114. The through aperture 114 extends from a front 111 of the open-ended support module 100 to a rear 112 of the open-ended support module 100. In one embodiment, the through aperture 114 has a side-to-side width sufficient to receive at least one computer chassis therein. However, in other embodiments, the through aperture's 114 width is sufficient to provide for two or more computer chassis 120. In one aspect, the through aperture 114 is partitioned into first and second computer chassis sub-bays 105, 106, respectively. The partition 107 may be a panel or a bracket, as shown, and may serve as additional support structure for the open-ended support module 100. The mounting flanges 108, 109 may be configured as shown with which bolts and nuts can be used to removably secure the open-ended support module 100 to a support frame. However, in other embodiments, the mounting flanges 108, 109 may include other means such as friction clamps that can be used to removably secure the open-ended support module 100 to a support frame.

In an alternative embodiment, the open-ended support module 100 may further include notches 113 in the first and second sides 103, 104, respectively, adjacent the rear of the open-end support module 100. As mentioned below, the notches 113 can serve as an opening to facilitate air flow into the back end of the computer chassis 120. When present in certain embodiments, the first and second mounting flanges 108, 109, respectively, extend laterally from the front end 111 on opposing sides of the open-ended support module 100. The open-ended support module 100 may be constructed of any suitable rigid sheet-like material such as sheet metal or hard plastic that is sufficiently strong to support the weight of the open-ended support module 100 or modules.

Referring now to FIG. 1B, illustrated is an isometric view of one embodiment of a computer chassis 120 constructed according to the principles of the present invention. Though the computer chassis 120 is not limited to any particular size, it is particularly advantageous that the computer chassis 120 is compact in size and significantly smaller that typical desk top models; that is the length may typically vary between about 12, 16, and 18 inches, while the overall width may vary between about 6 to 8 inches, and the thickness may be about 3 to 4 inches. The compact size of the computer chassis 120 is particularly advantageous in that the units can be centralized in one location, as opposed to computer chassis being located at multiple stations. The centralization provides greater control over the individual computer chassis, and given that they can be centralized in one location, security can be much improved. However, such centralization and the racking of multiple heat generating computer chassis gives rise to serious cooling considerations, which is what the present disclosure addresses.

In one embodiment, the computer chassis 120 comprises main and secondary cooling fans 121, 122, respectively; and top, side and front ventilation apertures, 123, 124, 125, respectively, and an optional swingable handle 126. The cooling fans 121, 122 and the ventilation apertures 123, 124, and 125 allow for an air flow in a direction that is from the back to the front of the computer chassis 120, and indicated by the large arrows shown in FIG. 1B. In this particular embodiment and when used in conjunction with the open-ended support module 100, this air flow allows for efficient cooling when multiple computer chassis 100 are racked together in one central location.

The main and secondary cooling fans 121, 122, respectively, are internal to the computer chassis 120. For clarity, the other components of the personal computer within the computer chassis 120, e.g., hard drive, motherboard, microprocessor, etc., are not shown and may be of conventional design. Ambient cooling air is drawn in through the top and side ventilation apertures 123, 124 by the main cooling fan 121. The air, having been heated by the electronics of the personal computer, is expelled through the front ventilation apertures 125 with the assistance of the secondary cooling fan 122. The optional swingable handle 126 is rotatably coupled to the upper front corners of the computer chassis 120 and may be used to carry, remove, and insert the computer chassis 120 into the first or second through apertures 105, 106, respectively. The mouse and keyboard connect to the computer chassis 120 over Ethernet. The end user can plug in any USB device at the client side and the signal is carried to the computer chassis 120 over Ethernet. The computer within the computer chassis 120 decodes the signal from Ethernet to USB and sees the mouse and keyboard. Power, Ethernet and PCoIP signal as made through the front panel of the computer chassis 120.

Figure 2:
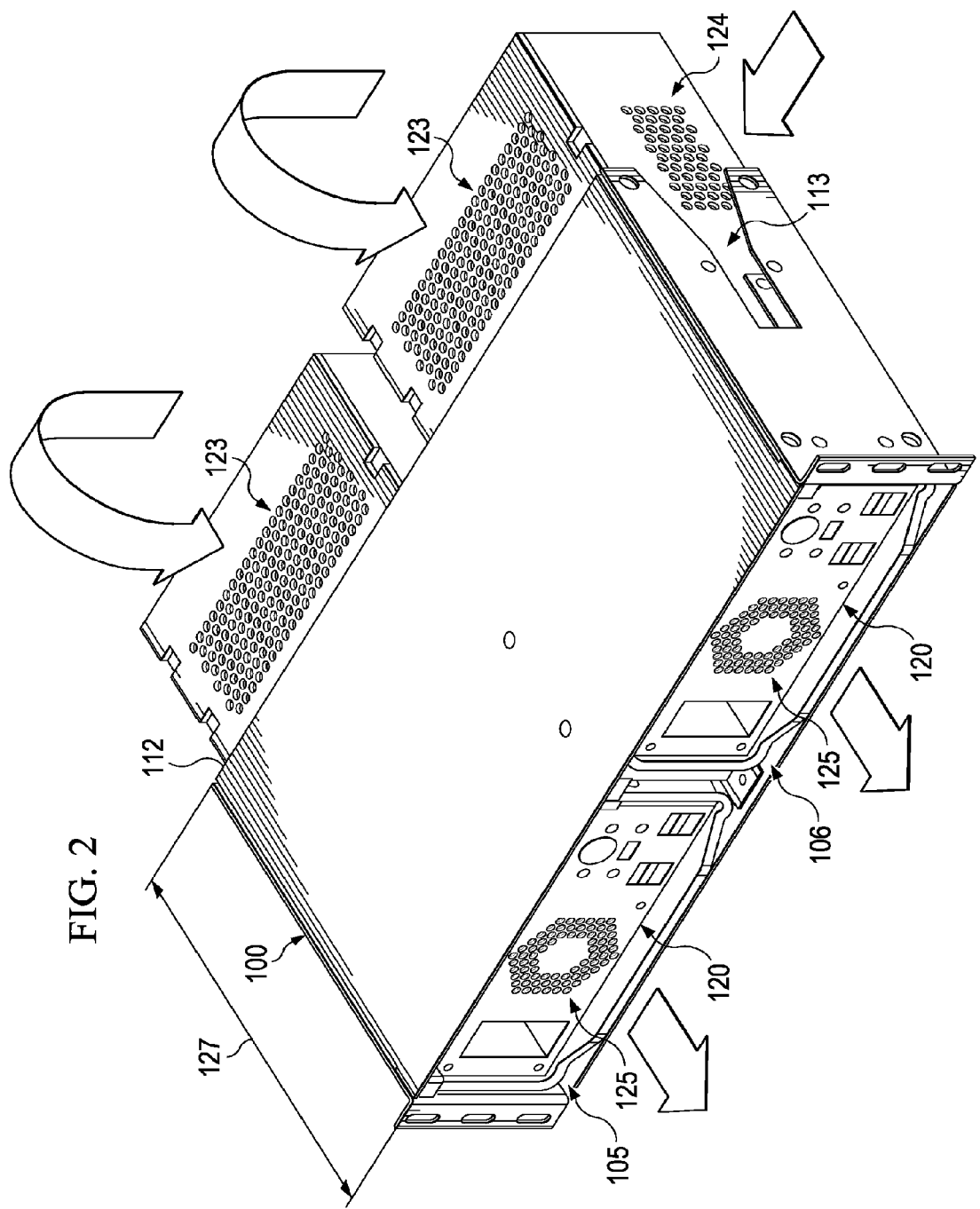
FIG. 2 is an isometric view of the open-ended support module with two personal computer chassis inserted therein.

Referring now to FIG. 2, illustrated is an isometric view of the open-ended support module 100 with two personal computer chassis 120 inserted therein. In this illustrated embodiment, the first and second computer chassis sub-bays 105, 106 are configured to each receive the personal computer chassis 120 therein, and the open-ended support module 100 has a front 111 to rear 112 length 127 such that the top ventilation apertures 123 adjacent the back end of the computer chassis 120 extend beyond the rear 112 of the open-ended support module 100. This cooperative configuration is particularly advantageous in that the air flow from the back to the front of the computer chassis 120 is not blocked or inhibited by any portion of the open-ended support module 100. Optional notches 113 in the first and second sides 102, 103, respectively, permit additional cooling air to enter through the side ventilation apertures 124 when the personal computer chassis 120 is fully inserted into the first and second computer chassis sub-bays 105, 106.

Figure 3:
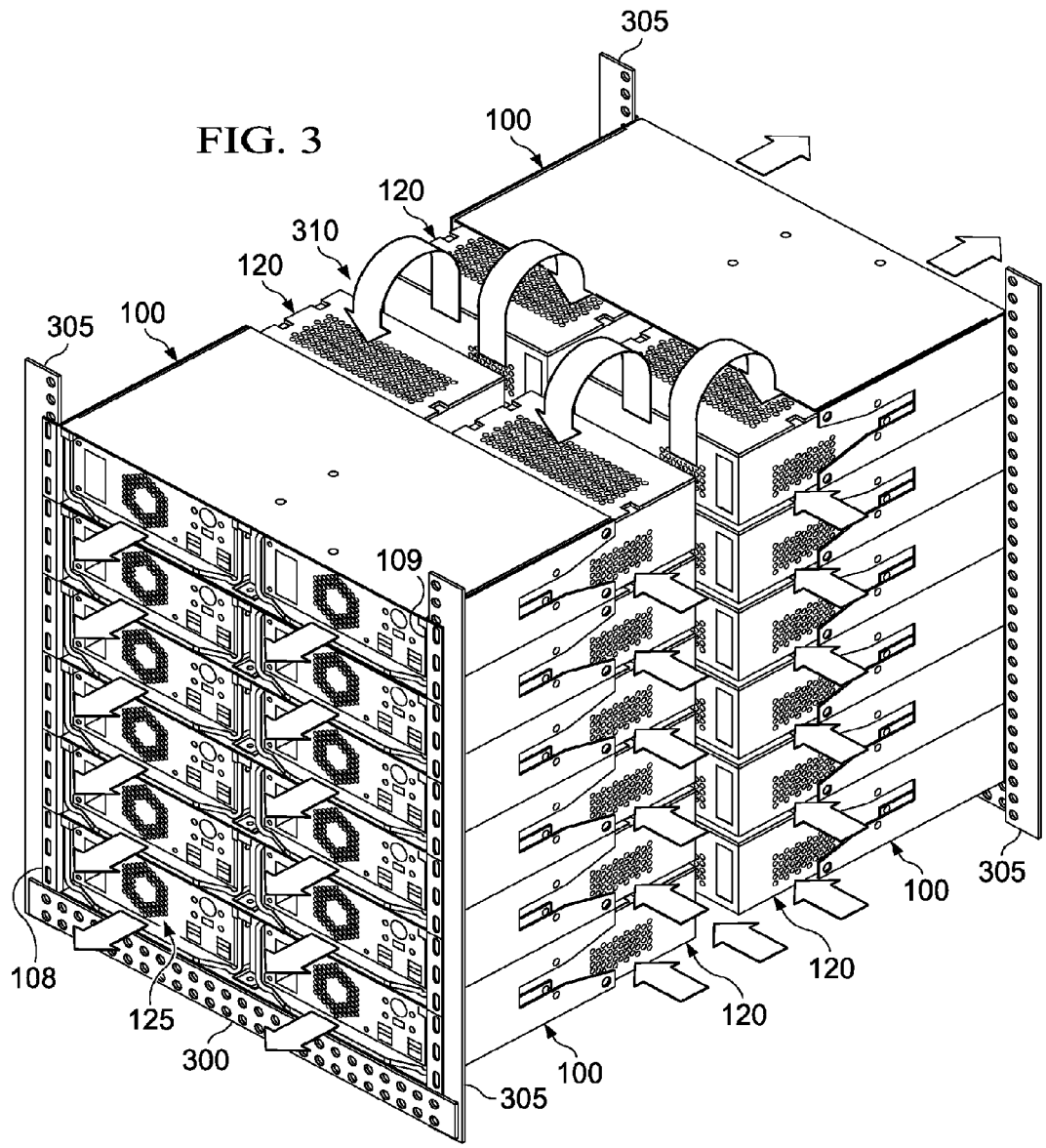
FIG. 3 is an isometric view of 12 open-ended support modules with two personal computer chassis inserted in each open-ended support module of a multi-position support rack.

Referring now to FIG. 3, illustrated is one embodiment of an isometric view of 12 open-ended support modules 100 with two personal computer chassis 120 inserted in each open-ended support module 100 of a multi-position support rack 300. The multi-position support rack 300 comprises a plurality of frame support members 305 coupled together to form a plurality of support locations for the open-ended support modules 100. The mounting flanges 108, 109 are configured to cooperate with the frame support members 305 to removably fasten the open-ended support modules 100 at the desired support locations. The top and sides have been removed from the multi-position support rack 300 for better viewing of the contents.

The two stacks of six open-ended support modules 100 with 12 personal computer chassis 120 each are located on opposing sides of the multi-position support rack 300 and are advantageously arranged such that the back ends of the computer chassis 120 oppose each other. This unique configuration forms an air passageway 310 between the rears of the two stacks of personal computer chassis 120 and forms an open air conduit for air to flow from the air passageway 310, through the computer chassis 120 and out the opposing sides of the multi-position support rack 300. More specifically, air flows into the top and optional side ventilation apertures 123, 124, respectively, of each of the personal computer chassis 120 and out the front ventilation apertures 125. This unique configuration allows for efficient cooling of multi-heat generating personal computers, while allowing them to be racked in a single centralized location.

While a multi-position support rack 300 with 24 personal computers is illustrated, one who is of skill in the art will recognize that the multi-position support rack 300 may comprise any number of open-ended support modules 100 arranged so as to position the computer chassis 120 mounted therein with the rear ends of the chassis opposing.

Thus, a stackable modular personal computer array has been described that concentrates the computer hardware in one large, multi-position support rack. Therefore, air conditioning can be provided to accommodate the heat output of the stackable modular personal computer array. With all of the computers commonly located, information can be accessed by any authorized used remotely from the computer array anywhere in the company as well as the information technology technician does not need to walk back and forth from the server room to the office with a computer problem.

Furthermore, connecting a keyboard, mouse, etc., can be readily accomplished to a problem computer and diagnosis made. If necessary, the problem computer can be removed from the open-ended support module and replaced with a known good computer.

Those skilled in the art to which this application relates will appreciate that other and further additions, deletions, substitutions and modifications may be made to the described embodiments, for instance the following example claims from U.S. Application Ser. No. 12/770,934, filed on Apr. 30, 2010 which have been incorporated herein:

1. A sub-rack module for supporting a personal computer chassis therein, comprising: an open-ended support module having a top, a bottom, and first and second sides, and a through aperture extending from a front of said open-ended support module to a rear of said open-ended support module, said through aperture having a side-to-side width sufficient to receive a computer chassis therein, said top of said open-ended support module having a front to rear length such that ventilation apertures of said computer chassis are exposed at said rear when said computer chassis is positioned within said open-ended support module.

2. The sub-rack module recited in claim 1 wherein said through aperture has a width configured to receive at least two computer chassis therein.

3. The sub-rack module recited in claim 2 wherein said through aperture is partitioned into at least two computer chassis sub-bays and each of said sub-bays has a width configured to receive a computer chassis therein.

4. The sub-rack module recited in claim 1 further comprising opposing mounting flanges laterally extending from a front end of said open-ended support module, wherein said mounting flanges are configured to enable said open-ended support module to be removably fastened to a supporting frame.

5. The sub-rack module recited in claim 1, wherein said first and second sides of said open-ended support module include notches adjacent said rear formed therein such that side ventilation apertures of a computer chassis are exposed through said notches when said computer chassis is positioned within said open-ended support module to allow air flow through said notches and into said computer chassis.

6. A system for stacking modular personal computers, comprising: open-ended support modules each having a top, a bottom, and first and second sides, and a through aperture extending from a front to a rear of each of said open-ended support modules, said through apertures having a side-to-side width sufficient to receive at least one computer chassis therein, said top having a front to rear length such that ventilation apertures of a computer chassis are exposed at said rear when said computer chassis is positioned within said open-ended support module; and a multi-position support rack having frame support members coupled together to form a plurality of support locations for said open-ended support modules, and wherein said open-ended support modules are located within and supported by said multi-position support rack at least a portion of said support locations.

7. The system recited in claim 6 further including at least one computer chassis received in at least a portion of said open-ended support modules, said at least one computer chassis having top ventilation apertures located on a top side adjacent a back end thereof, side ventilation apertures located on first and second sides adjacent said back end thereof, and front ventilation apertures located on a front side of said computer chassis.

8. The system recited in claim 7 wherein said frame support members have support locations on opposing sides of said multi-position support rack and wherein said open-ended support modules are positioned vertically and horizontally with respect to each other within said multi-position support rack and are removably secured to said multi-position support rack at said support locations such that said top ventilation apertures of said computer chassis are opposing each other and spaced apart to form an air passageway between opposing back ends of said computer chassis, said computer chassis having at least one fan located therein that directs air through said top ventilation apertures at said back end of said computer chassis and toward and through said front ventilation apertures, such that air is circulated from said passageway and through each of said computer chassis and outward through said front ventilation apertures.

9. The system recited in claim 7 wherein said first and second sides of said open-ended support modules include notches formed therein adjacent said rear such that said side ventilation apertures are exposed through said notches when said at least one computer chassis is positioned within said open-ended support module to allow air flow through said notches and into said computer chassis through said side ventilation apertures.

10. The system recited in claim 7, wherein said computer chassis further includes a rotatable handle attached in said front side of said computer chassis.

11. The system recited in claim 6 wherein each of said open-ended support modules further comprise opposing mounting flanges laterally extending from said front of each of said open-ended support modules, wherein said mounting flanges and said frame support members are configured to enable said open-ended support modules to be removably fastened to said frame support members at said support locations of said multi-position support rack.

12. A method of manufacturing a system for stacking modular personal computers, comprising: forming a plurality of open-ended support modules, each having a top, a bottom, and first and second sides, and a through aperture extending from a front of said open-ended support module to a rear of said open-ended support module, said through aperture having a side-to-side width sufficient to receive at least one computer chassis therein, said top side of said open-ended support module having a front to rear length such that ventilation apertures of said computer chassis are exposed at said rear of said open-ended support module when said computer chassis is positioned within said open-ended support module; forming a multi-position support rack having frame support members coupled together to form a plurality of support locations for said open-ended support modules; and removably securing at least a portion of said open-ended support modules within said multi-position support rack at one of said support locations.

13. The method recited in claim 12 further comprising placing at least one computer chassis in at least one of said open-ended support modules such that top ventilation apertures located on a top side and adjacent a back end of said computer chassis extend beyond said top side of said open-ended support module.

14. The method recited in claim 13 wherein removably securing one of said open-ended support modules further comprises removably securing said open-ended support modules within said frame support at support locations on opposing sides of said multi-position support rack and wherein said open-ended support modules are positioned vertically and horizontally with respect to each other within said multi-position support rack such that said top ventilation apertures of said computer chassis are opposing each other and spaced apart to form an air passageway between said rear ends of said computer chassis.

15. The method recited in claim 13 wherein forming a plurality of open-ended support modules includes forming open-ended support modules having first and second sides that include notches formed therein adjacent said rear such that side ventilation apertures of said computer chassis are exposed through said notches when said computer chassis is positioned within said open-ended support module to allow air flow through said notches and into said computer chassis through said side ventilation apertures.

16. The method recited in claim 12, wherein forming a plurality of open-ended support modules further comprises forming opposing mounting flanges laterally extending from a front end of said open-ended support module, wherein said mounting flanges are configured to enable said open-ended support modules to be fastened to a supporting frame, and removably securing includes securing said open-ended support modules to said frame support members via said mounting flanges.

17. The method recited in claim 12 wherein forming a plurality of open-ended support modules comprises forming said through aperture with a width configured to receive at least two computer chassis therein.

18. The method recited in claim 17 wherein forming a plurality of open-ended support modules comprises partitioning said through aperture into at least two computer chassis sub-bays and each of said sub-bays has a width configured to receive a computer chassis therein.

What is claimed:

1. A storage system comprising:
   a first plurality of computer housings;
   a second plurality of computer housings;
   a third plurality of computer housings;
   a fourth plurality of computer housings;
   a storage unit, including:
   a first plurality of sleeves sized to slidingly accommodate the first plurality of computer housings wherein each sleeve in the first plurality of sleeves is positioned vertically with respect to its adjacent sleeve in the first plurality of sleeves to form a first stack of sleeves,
   a second plurality of sleeves sized to slidingly accommodate the second plurality of computer housings wherein each sleeve in the second plurality of sleeves is positioned vertically with respect to its adjacent sleeve in the second plurality of sleeves to form a second stack of sleeves,
   a third plurality of sleeves sized to slidingly accommodate the third plurality of computer housings wherein each sleeve in the third plurality of sleeves is positioned vertically with respect to its adjacent sleeve in the third plurality of sleeves to form a third stack of sleeves,
   a fourth plurality of sleeves sized to slidingly accommodate the fourth plurality of computer housings wherein each sleeve in the fourth plurality of sleeves is positioned vertically with respect to its adjacent sleeve in the fourth plurality of sleeves to form a fourth stack of sleeve,
   wherein the first stack of sleeves is positioned adjacent to the second stack of sleeves to form a first row of stacks having a front side and a back side,
   wherein the third stack of sleeves is positioned adjacent to the fourth stack of sleeves to form a second row of stacks having a front side and a back side,
   wherein the first row of stacks is positioned adjacent to the second row of stacks such that the back side of the first row of stacks and the back side of the second row of stacks face each other and form an unobstructed space to create an air vertical flow path,
   wherein each computer housing of the first, second, third, and fourth pluralities of computer housings further comprises: a first plurality of inlet air flow holes defined on a side wall of each housing, and a second plurality of inlet air flow holes defined on a top wall of each housing such that the second plurality of inlet air flow holes are exposed beyond a rear of the respective sleeve of the first, second, third, and fourth plurality of sleeves, and a first plurality of outlet air flow holes defined on a front wall of each housing,
   wherein each computer housing of the first, second, third, and fourth pluralities of computer housings further comprises a plurality of apertures defined on the front wall of each computer housing sized to allow the passage of network and power cords, and
   wherein each computer housing of the first, second, third, and fourth pluralities of computer housings is coupled to a rotatable handle and a fastening mechanism to secure each computer housing to a support frame.

2. A storage system comprising:
   a first plurality of computer housings;
   a second plurality of computer housings;
   a third plurality of computer housings;
   a fourth plurality of computer housings;
   a storage unit, including:
   a first plurality of sleeves sized to slidingly accommodate the first plurality of computer housings wherein each sleeve in the first plurality of sleeves is positioned vertically with respect to its adjacent sleeve in the first plurality of sleeves to form a first stack of sleeves,
   a second plurality of sleeves sized to slidingly accommodate the second plurality of computer housings wherein each sleeve in the second plurality of sleeves is positioned vertically with respect to its adjacent sleeve in the second plurality of sleeves to form a second stack of sleeves,
   a third plurality of sleeves sized to slidingly accommodate the third plurality of computer housings wherein each sleeve in the third plurality of sleeves is positioned vertically with respect to its adjacent sleeve in the third plurality of sleeves to form a third stack of sleeves,
   a fourth plurality of sleeves sized to slidingly accommodate the fourth plurality of computer housings wherein each sleeve in the fourth plurality of sleeves is positioned vertically with respect to its adjacent sleeve in the fourth plurality of sleeves to form a fourth stack of sleeve,
   wherein the first stack of sleeves is positioned adjacent to the second stack of sleeves to form a first row of stacks having a front side and a back side,
   wherein the third stack of sleeves is positioned adjacent to the fourth stack of sleeves to form a second row of stacks having a front side and a back side,
   wherein the first row of stacks is positioned adjacent to the second row of stacks such that the back side of the first row of stacks and the back side of the second row of stacks face each other and form an unobstructed air flow path, and
   wherein each computer housing of the first, second, third, and fourth pluralities of computer housings further comprises:
   a first plurality of inlet air flow holes defined on a side wall of each housing, and
   a second plurality of inlet air flow holes defined on a top wall of each housing such that the second plurality of inlet air flow holes are exposed beyond a rear of the respective sleeve of the first, second, third, and fourth plurality of sleeves,
a first plurality of outlet air flow holes defined on a front wall of each housing; and
wherein each computer housing of the first, second, third, and fourth pluralities of computer housings further comprises a plurality of apertures defined on a front wall of each computer housing sized to allow the passage of network and power cords.

3. The storage system of claim 2, wherein each computer housing of the first, second, third, and fourth pluralities of computer housings is coupled to a rotatable handle.

4. The storage system of claim 2, wherein each computer housing of the first, second, third, and fourth pluralities of computer housings is coupled to fastening mechanism to releasibly secure each computer housing to a support frame.

5. A method of cooling a plurality of computers, where each computer has a housing, the method comprising:
positioning a first plurality of computers into a first plurality of sleeves, wherein each sleeve in the first plurality of computers is sized to slidingly accommodate at least one of the first plurality of computers wherein each sleeve in the first plurality of sleeves is positioned vertically with respect to its adjacent sleeve in the first plurality of sleeves to form a first stack of sleeves,
positioning a second plurality of computers into a second plurality of sleeves, wherein each sleeve in the second plurality of sleeves is sized to slidingly accommodate at least one of the second plurality of computers wherein each sleeve in the second plurality of sleeves is positioned vertically with respect to its adjacent sleeve in the second plurality of sleeves to form a second stack of sleeves,
positioning a third plurality of computers into a third plurality of sleeves, wherein each sleeve in the third plurality of sleeves sized to slidingly accommodate at least one of the third plurality of computers wherein each sleeve in the third plurality of sleeves is positioned vertically with respect to its adjacent sleeve in the third plurality of sleeves to form a third stack of sleeves,
positioning a fourth plurality of computers into a fourth plurality of sleeves, wherein each sleeve in the fourth plurality of sleeves is sized to slidingly accommodate at least one computer of the fourth plurality of computers wherein each sleeve in the fourth plurality of sleeves is positioned vertically with respect to its adjacent sleeve in the fourth plurality of sleeves to form a fourth stack of sleeve,
positioning the first stack of sleeves adjacent to the second stack of sleeves to form a first row of stacks having a front side and a back side,
positioning the third stack of sleeves adjacent to the fourth stack of sleeves to form a second row of stacks having a front side and a back side,
positioning the first row of stacks adjacent to the second row of stacks such that the back side of the first row of stacks and the back side of the second row of stacks face each other and form an unobstructed vertical air flow path,
creating an outlet air current from an inside space of each computer to an exterior space proximate to each computer through a plurality of outlet air flow holes defined within a front wall of each computer housing,
creating a first inlet air current from the vertical air flow path to the inside space of each computer through a plurality of holes defined on a top wall of each computer such that the plurality of holes are exposed beyond a rear of the respective sleeve of the first, second, third, and fourth plurality of sleeves, and
creating a second inlet air flow from the exterior space proximate to each computer to the inside space of each computer through a plurality of inlet air flow holes defined on a side wall of each computer.

* * * * *